United States Patent [19]
Steketee

[11] Patent Number: 5,831,160
[45] Date of Patent: Nov. 3, 1998

[54] TEST FIXTURE CLAMPING SYSTEM

[75] Inventor: Edward Steketee, Ft. Collins, Colo.

[73] Assignee: Hewlett-Packard Company, Palo Alto, Calif.

[21] Appl. No.: 862,091

[22] Filed: May 22, 1997

[51] Int. Cl.⁶ .................................................. G01R 31/02
[52] U.S. Cl. ............................................. 73/431; 324/754
[58] Field of Search ............................. 73/431; 324/754, 324/755, 758–762; 269/86, 90, 91, 126–128, 136, 138, 216, 217, 221, 229, 230, 236, 288–290, 909

[56] References Cited

U.S. PATENT DOCUMENTS

| | | | |
|---|---|---|---|
| 142,697 | 9/1873 | Holmes | 269/229 |
| 2,851,913 | 9/1958 | Ramoneda | 269/127 |
| 5,055,777 | 10/1991 | Bonelli et al. | 324/761 |
| 5,436,567 | 7/1995 | Wexler et al. | 324/761 |
| 5,493,237 | 2/1996 | Volz et al. | 324/755 |

*Primary Examiner*—Robert Raevis

[57] ABSTRACT

A test fixture clamping system is described for holding a circuit board in a test fixture for testing. The clamping system includes upper and lower frame members which are pivotably connected, a pressure plate carried by the upper frame member and being movable between raised and lowered positions, cams carried by the upper frame member and being movable so as to move the pressure plate from a raised position to a lowered position, and a handle for controlling movement of the cam. Preferably the cams include rollers which move on ramps carried by the pressure plate for smooth and easy movement.

31 Claims, 5 Drawing Sheets

TEST FIXTURE CLAMPING SYSTEM

FIELD OF THE INVENTION

This invention relates to apparatus for stabilizing a printed circuit board or card or other device for testing. More particularly, this invention relates to clamp mechanisms for supporting a printed circuit board or card or device for testing. Even more particularly, this invention relates to clamp mechanisms for holding and supporting a printed circuit board, card or device on the top of a test platform or fixture.

BACKGROUND OF THE INVENTION

High frequency electronic circuits must be electronically tested before being sold to assure that they work properly. Such electronic circuits generate, and are susceptible to, radio frequency (RF) interference. In the case of wireless and cellular communication devices, pagers, radios and high speed computing equipment, RF shielded test enclosures are needed in order to isolate individual devices being tested from transmitting or receiving interfering signals. This is especially of concern in the manufacturing test environment in which printed circuit assemblies are being functionally tested or calibrated prior to assembly into a product enclosure.

In a production environment multiple devices may be tested simultaneously in the same area. In low to moderate volume production facilities much of the circuit testing is performed using manually-operated fixtures. These test fixtures typically require multiple operations to clamp, close and lock the device to be tested in the test fixture.

Conventional test fixtures involve the use of a clamp which includes a gear system to close and lock it. The gear system is subject to wear and involves many separate parts. Such a clamp system is cumbersome to repair or adjust.

There has not heretofore been provided a test fixture clamping system having the features and advantages provided by the present invention.

SUMMARY OF THE INVENTION

In accordance with the present invention there is provided a test fixture clamping system which is simple, reliable, and easy to operate. The clamping system is adapted to apply firm and even pressure to a pressure plate for urging a circuit to be tested downwardly to be in contact with appropriate test probes in a test fixture.

In a preferred embodiment, the clamping system comprises:

(a) upper and lower frame means which are pivotably connected;

(b) pressure plate means carried by the upper frame means and being movable between raised and lowered positions;

(c) cam means carried by the upper frame means and being movable in a manner such that the pressure plate means is caused to move from the raised position to the lowered position; and (d) handle means carried by the upper frame means for controlling movement of the cam means.

Preferably there are ramps carried by the pressure plate which are contacted by the cam means for moving the pressure plate to its lowered position (where the circuit board to be tested is urged into contact with the test probes of the test fixture). Preferably also the lower end of each cam includes a roller for rolling on a respective ramp.

The handle means moves smoothly and easily between open and closed positions. When the handle is in the open position the upper frame means can be pivoted upwardly relative to the lower frame means. When the circuit board to be tested is placed in the fixture above the probes, the upper frame means is pivoted downwardly against the lower frame means. Then the handle is moved to its closed position which causes the cams to move up the ramps and urge the pressure plate downwardly. This action causes the circuit board to be urged downwardly into contact with the test probes.

When the handle is in its fully-closed position, the handle preferably engages a switch which allows the test probes to be electrically activated. Conversely, when the handle moves away from its closed position, the switch opens and thereby deactivates the test probes. This is an important safety feature.

The clamping system of this invention overcomes the limitations and disadvantages of prior systems by providing a manually-operated mechanism which locks the fixture and clamps the device to be tested to the interconnect assembly. Optionally, movement of the handle to its fully-closed position can activate the start of the test operation automatically.

Other advantages and features of the clamping system will be apparent from the following detailed description and the accompanying drawings.

BRIEF DESCRIPTION OF THE DRAWINGS

The invention is described in more detail hereinafter with reference to the accompanying drawings, wherein like reference characters refer to the same parts throughout the several views and in which.

DETAILED DESCRIPTION OF THE INVENTION

Figure 1:
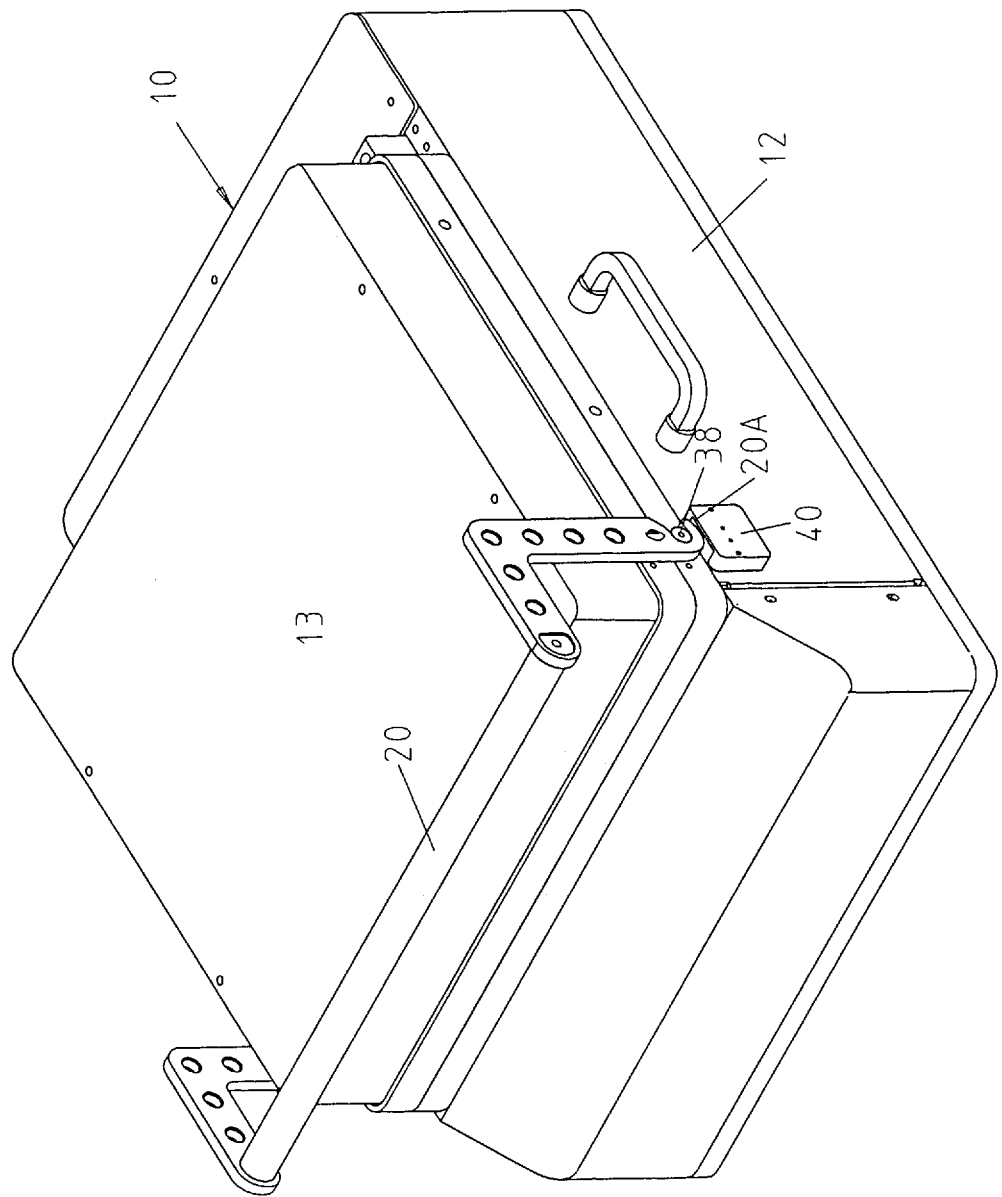
FIG. 1 is an isometric view of a test fixture which includes the clamping system of this invention.

A test fixture 10 is shown in the drawings which includes an enclosure or housing 12. Within the test fixture there are normally a plurality of test probes 14 which are connected to appropriate circuitry for testing a circuit board in an electronic device.

To the upper surface of the test fixture shown in the drawings there is secured the improved clamping system of this invention which comprises lower frame member 16 and upper frame member 18. The lower frame member is secured to the top of the test fixture in a fixed position by means of conventional fasteners such as screws. The upper frame member is pivotably attached to the rear edge of the lower frame member by means of one or more hinge pins 17. A cover 13 normally is attached to the upper frame means, as shown.

Figure 2:
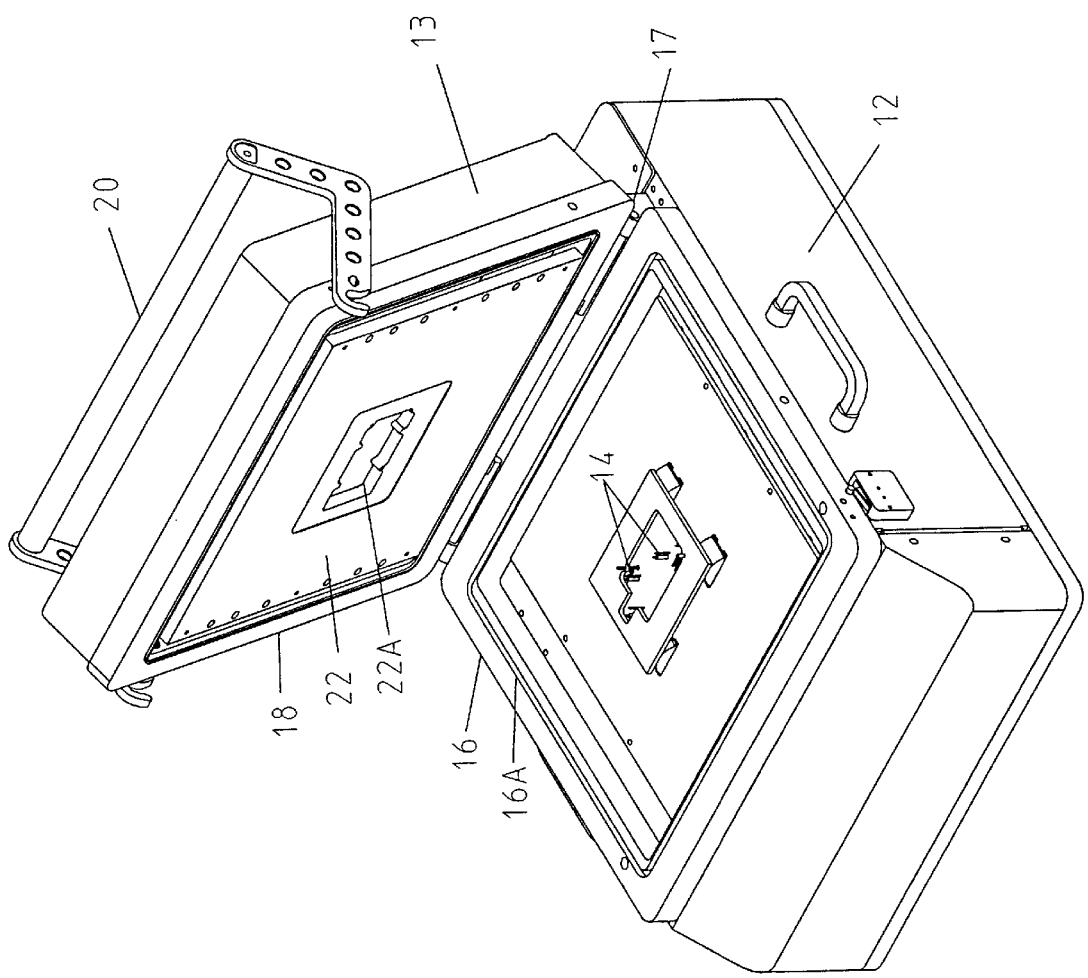
FIG. 2 is an isometric view of the test fixture of FIG. 1 with the clamp in the open position.

The upper frame member is pivotable between a closed position (FIG. 1) and an open position (FIG. 2). When the upper frame member is in the raised or open position, an electronic device 11 (e.g., printed circuit board, circuit card, etc.) can be positioned in the test fixture above the probes 14. Then the upper frame member is pivoted downwardly to close the unit.

Figure 3:
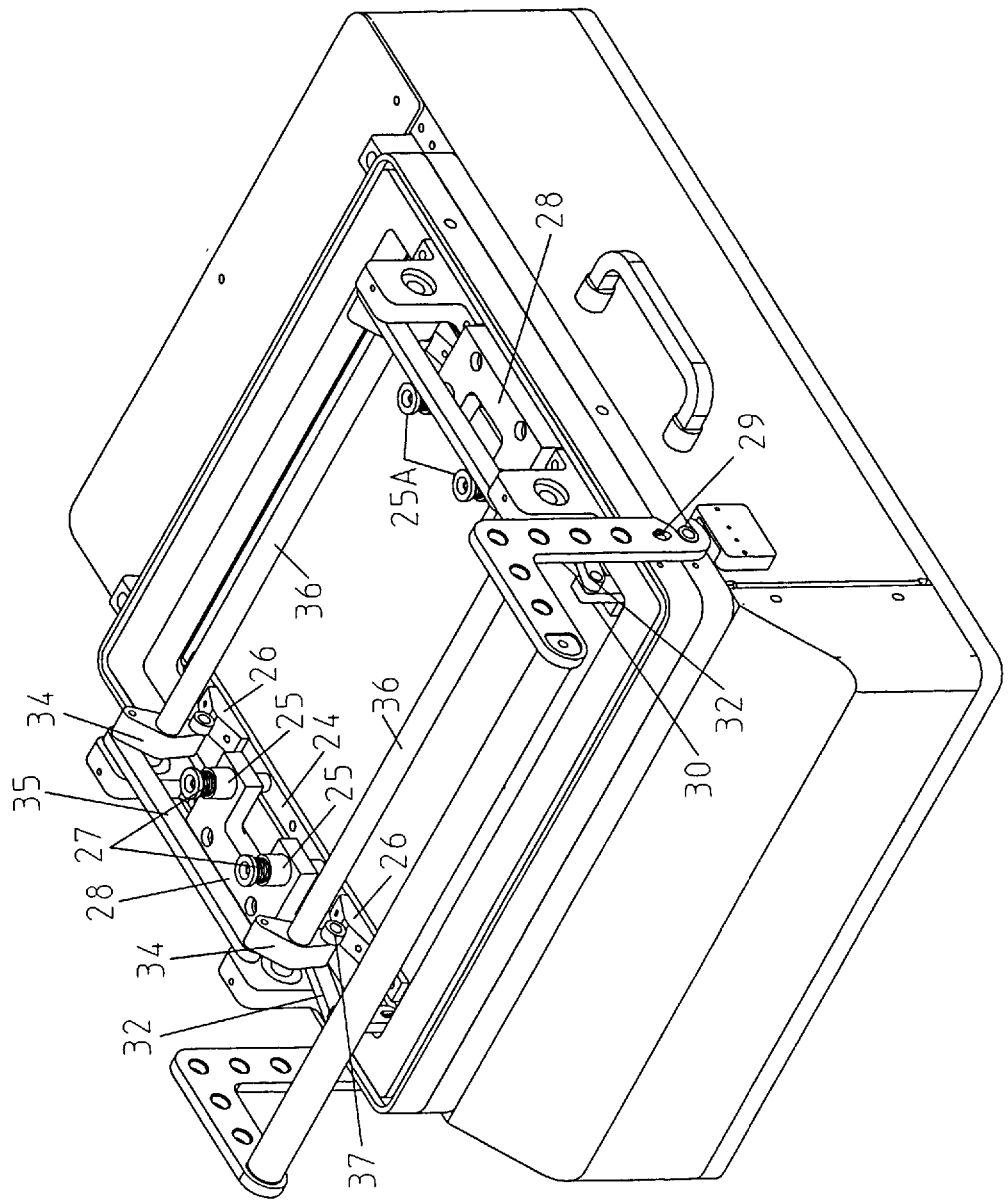
FIG. 3 is an isometric view of the test fixture of FIG. 1 with the cover removed.

The upper frame 18 includes a pressure plate 22 (which may or may not include a cut-out area 22a, depending upon the physical configuration of the device being tested in the fixture). In FIG. 3 a pressure plate 23 is shown which does not include any cut-out area. Rather, it is shown as a continuous rigid plate having planar upper and lower surfaces. The pressure plate is non-conductive and has parallel upper and lower surfaces. Preferably it is composed of a material which has a low thermal expansion coefficient. The size and shape of the plate may vary.

Along opposite side edges of the upper surface of the pressure plate there are secured elongated bar members 24. These bar members not only provide stiffening and physical reinforcement to the pressure plate but they also serve as an attachment base for the ramps 26. Also secured to bar members 24 are pin assemblies 25 having enlarged heads 25a. The pins extend vertically upward from the bars 24 through linear bearings or bushings in bracket 28. A spring 27 biases each pin to a normal upward position. Because each pin is secured at its lower end to bar 24, the springs effectively bias the pressure plate to a normal upward position. Preferably there are two spaced-apart pin assemblies 25 secured to each bar member 24, although there could be more such pins associated with each bar 24, if desired.

Figure 4:
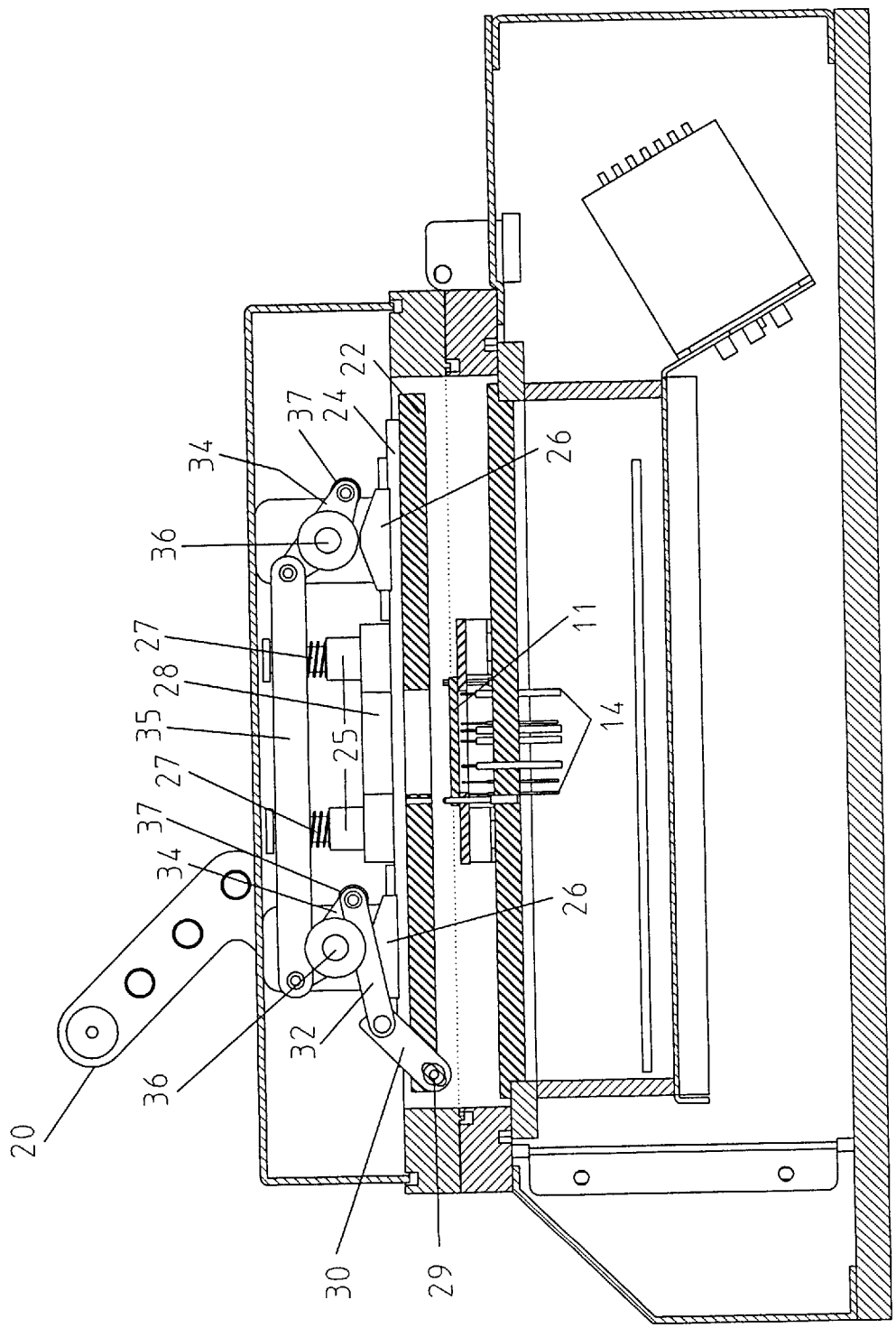
FIG. 4 is a cut-away elevational view of the test fixture of FIG. 1 with the handle in its open position.
Figure 5:
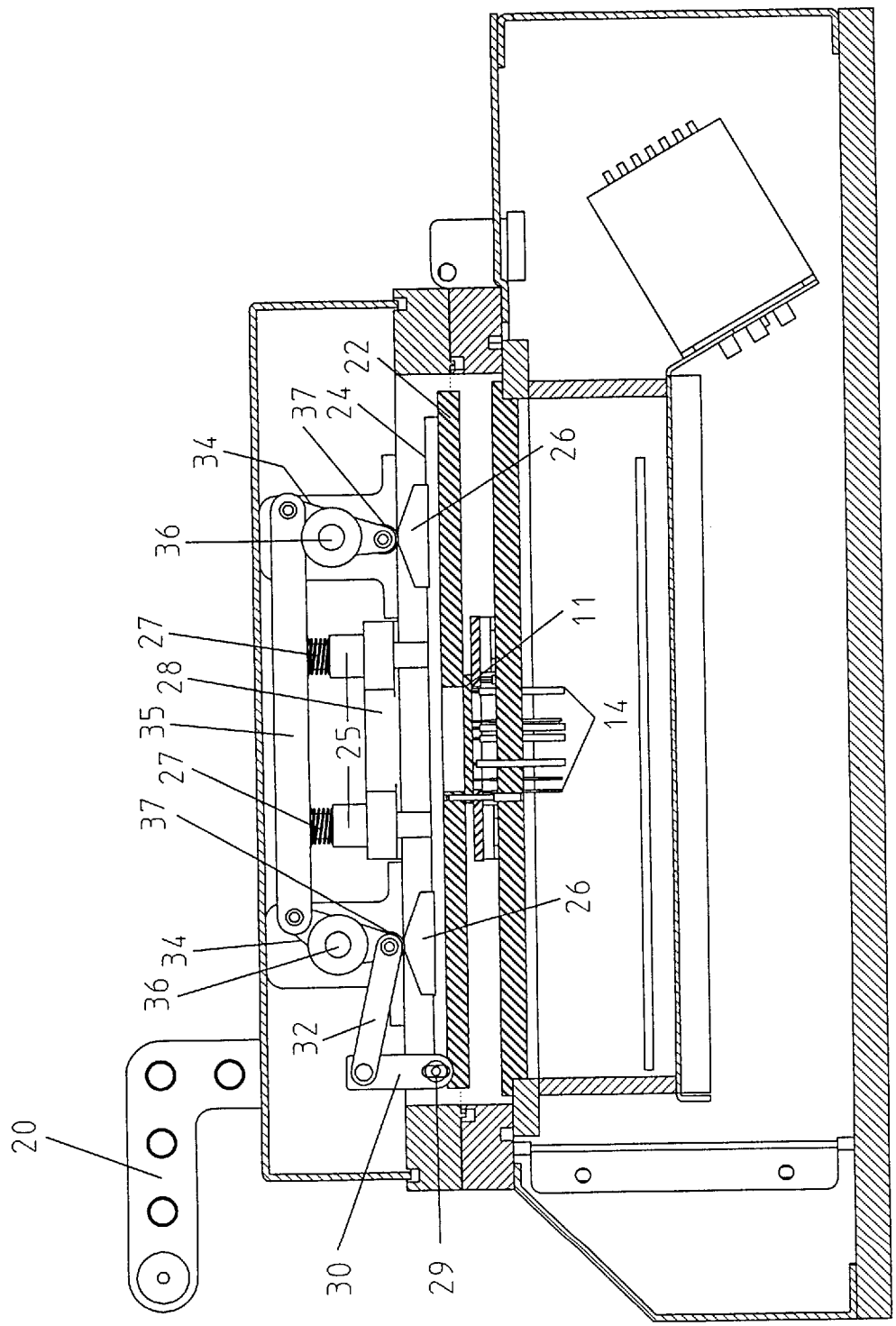
FIG. 5 is a cut-away elevational view of the test fixture of FIG. 1 with the handle in its closed position and the circuit board in contact with the test probes.

Movement of the pressure plate 22 from its upward position to its downward or lower position is controlled by means of movement of the handle 20. When the clamp is in its open position the handle 20 is in a rearward position, as shown in FIGS. 2 and 4. When the upper frame 18 is in a downward or closed position (i.e., in contact with the lower frame 16) the handle can be pulled forwardly toward the operator. The handle pivots on the outer end of hinge pins 29 which are rotatably mounted on opposite sides of frame 18. The inner ends of pins 29 are each connected to the lower end of an arm 30. Because each end of the pins 29 is non-circular in cross-section (preferably a blade shape), movement of the handle causes the pin 29 to rotate within frame 18, and arm 30 is thereby caused to pivot about its lower end.

Connected to the upper end of each arm 30 is a link 32. The opposite end of link 32 is connected to the lower end of cam member 34 mounted on transverse shaft 36. Linkage 35 is connected between the upper ends of cam members 34 along each side edge of the clamp, as shown. Thus, forward movement of handle 20 causes the cam members to rotate or pivot about the axis of shaft 36, and the lower end of each cam member moves upwardly on a respective ramp member 26. This forces the pressure plate 22 downwardly relative to the upper frame 18, whereby the circuit board to be tested is urged downwardly into contact with the probes 14.

Preferably the clamping system is appropriately shielded so as to prevent RF interference. For example, in groove 16A which extends around the face of frame member 16 there is preferably positioned a compliant conductive gasket (e.g., a braided conductive material) so that when the clamp is in the closed position, RF interference is prevented during the testing. Preferably the upper and lower frame members 16 and 18 are composed of metal and may be plated with a non-corrosive conductive material such as nickel or chromium. Additional types of RF shielding can also be included in the clamp system or in the test fixture, if desired.

Preferably the lower end of each cam member has rotatably attached to it a high load needle bearing 37 which is pre-lubricated. Such a bearing provides very low friction for rolling on ramp 26 when the cam 34 is caused to rotate or pivot about the axis of shaft 36. The number and size of ramps 26 may vary. Preferably there is at least one such ramp (and associated cam 34) located in each quadrant of the pressure plate to assure that the pressure plate moves upwardly and downwardly uniformly along a line which is perpendicular to the plate itself, with uniform pressure being applied by the lower surface of the plate to the circuit board being tested.

The shape and height of the ramp members may also vary, as desired. For greater vertical movement of the pressure plate, the ramp members may be taller than as shown in the drawings, for example.

When the handle member 20 is being pulled forwardly after the upper frame member is in contact with the lower frame member, the lower slotted end 20A of each handle arm engages a lock bearing 38 attached to the side of the lower frame member. Bearing 38 is a high load needle bearing which is pre-lubricated, and when the slotted end of the handle arm engages the bearing, the clamp is effectively locked in the closed position. Preferably a safety switch 40 is positioned on the test fixture just below bearing 38 so that the lower end of the handle arm activates the switch to enable electrical testing of the circuit board to begin. When the handle 20 is moved rearwardly a few degrees, end 20A is moved away from bearing 38 and switch 40, whereby electrical operations within the test fixture are prevented due to the opening of switch 40. This is an important safety feature.

Another desirable feature of the clamp system of this invention is the symmetry between the left and right sides, and also the front and rear, of the clamping mechanism. All of the cam members and the ramp members are the same, thereby assuring appropriate symmetrical movement of the pressure plate as it moves between its raised and lowered positions. Also, this simplifies manufacturing and assembly processes for the clamp system. Further, it simplifies repair and service functions because the parts are interchangeable between the front and the rear and between each side of the mechanism.

The geometry of the clamp mechanism components provides a high mechanical advantage in operating the clamping of the pressure plate. Large clamping forces are generated with minimal effort by the operator.

Other variants are possible without departing from the scope and intent of this invention.

What is claimed is:

1. A test fixture clamping system for holding a circuit board in a test fixture for testing comprising:

(a) upper and lower frame means pivotably connected to each other;

(b) pressure plate means carried by said upper frame means and being movable between raised and lowered positions; wherein said pressure plate means is biased toward its said raised position by means of springs;

(c) cam means carried by said upper frame means and being movable in a manner such that said pressure plate means is caused to move from said raised position to said lowered position; and (d) handle means carried by said upper frame means for controlling movement of said cam means.

2. A clamping system in accordance with claim 1, wherein there are at least two said cam means.

3. A clamping system in accordance with claim 2, wherein said pressure plate means includes opposite side edges, and wherein one of said cam means is disposed along one of said side edges and the other of said cam means is disposed along the other of said side edges.

4. A clamping system in accordance with claim 1, wherein there are four of said cam means.

5. A clamping system in accordance with claim 4, wherein said pressure plate means includes opposite side edges, and wherein two of said cam means are disposed along one of said side edges and the other two of said cam means are disposed along the other of said side edges.

6. A clamping system in accordance with claim 5, wherein said cam means are pivotably mounted on shafts carried by said upper frame means.

7. A clamping system in accordance with claim 1, wherein said cam means is pivotably mounted to said upper frame means.

8. A clamping system in accordance with claim 1, wherein said handle means is pivotably mounted to said upper frame means.

9. A clamping system in accordance with claim 5, further comprising linking means connected between said handle means and said cam means.

10. A clamping system in accordance with claim 9, further comprising ramp means carried by said pressure plate means, and wherein said cam means is in contact with said ramp means.

11. A clamping system in accordance with claim 10, wherein said cam means is movable between first and second positions; wherein said cam means moves up said ramp means to move said pressure plate means from said raised position to said lowered position.

12. A clamping system in accordance with claim 11, wherein said cam means further comprises a roller rotatably mounted to said cam means and being in contact with said ramp means.

13. A clamping system in accordance with claim 1, wherein said upper and lower frame means further comprise RF shielding.

14. A test fixture clamping system for holding a circuit board in a test fixture for testing comprising:
  (a) upper and lower frame means which are pivotably connected together;
  (b) pressure plate means carried by said upper frame means and being movable between raised and lowered positions; wherein said plate means is biased toward its said raised position;
  (c) cam means carried by said upper frame means and being movable in a manner such that said pressure plate means is caused to move from said raised position to said lowered position; wherein there are at least two said cam means which are pivotably mounted to said upper frame means; and
  (d) handle means pivotably carried by said upper frame means for controlling movement of said cam means.

15. A clamping system in accordance with claim 14, further comprising linking means connected between said handle means and said cam means.

16. A clamping system in accordance with claim 15, wherein said pressure plate includes opposite side edges, wherein one of said cam means is disposed along one of said side edges and the other of said cam means is disposed along the other of said side edges; wherein said cam means are pivotably mounted on shafts carried by said upper frame means.

17. A clamping system in accordance with claim 16, further comprising first and second ramp means, wherein said first ramp means is carried by one said side edge of said plate means and the second ramp means is carried by the other said side edge of said plate means; and wherein each said cam means further comprises a roller rotatably mounted to said cam means and being in contact with a respective one of said ramp means.

18. A clamping system in accordance with claim 17, wherein said upper and lower frame means further comprises RF shielding.

19. In a test fixture for testing of an electronic device, wherein the test fixture includes a housing and probes for contacting a circuit to be tested in said electronic device, wherein the improvement comprises a clamping system secured to said test fixture for stabilizing said device and urging it toward said probes such that said circuit is contacted by said probes for testing, wherein said clamping system comprises:
  (a) upper and lower frame means pivotably connected to each other and carried by said test fixture;
  (b) pressure plate means carried by said upper frame means and being movable between raised and lowered positions;
  (c) cam means carried by said upper frame means and being movable in a manner such that it causes said pressure plate means to move from said raised position to said lowered position; and
  (d) handle means carried by said upper plate means for controlling movement of said cam means.

20. A clamping system in accordance with claim 20, wherein said pressure plate means is biased toward its said raised position.

21. A clamping system in accordance with claim 20, wherein said cam means is pivotably mounted to said upper frame means.

22. A clamping system in accordance with claim 20, wherein said handle means is pivotably mounted to said upper frame means, and further comprising linking means connected between said handle means and said cam means.

23. A clamping system in accordance with claim 22, further comprising ramp means carried by said pressure plate means, and wherein said cam means is in contact with said ramp means.

24. A clamping system in accordance with claim 23, wherein said cam means further comprises a roller rotatably mounted to said cam means and being in contact with said ramp means; wherein said cam means moves up said ramp means to move said pressure plate means from said raised position to said lowered position.

25. A clamping system in accordance with claim 19, wherein said pressure plate means includes opposite side edges; wherein there are at least two said cam means; and wherein one of said cam means is disposed along one of said side edges and the other of said cam means is disposed along the other of said side edges.

26. A clamping system in accordance with claim 25, wherein there are four of said cam means; wherein two of said cam means are disposed along one of said side edges and the other two of said cam means are disposed along the other of said side edges.

27. A clamping system in accordance with claim 26, wherein said cam means are pivotably mounted on shafts carried by said upper frame means.

28. A clamping system in accordance with claim 19, wherein said upper and lower frame means further comprise RF shielding.

29. A clamping system in accordance with claim 19, wherein said handle means is movable between open and closed positions; and further comprising switch means engaged by said handle means when said handle means is in said closed position; wherein said switch means deactivates said test fixture when said handle means is moved away from said closed position.

30. A test fixture clamping system for holding a circuit board in a test fixture for testing comprising:

(a) upper and lower frame means pivotably connected to each other;

(b) pressure plate means carried by said upper frame means and being movable between raised and lowered positions; wherein said pressure plate means is biased toward its said raised position;

(c) cam means carried by said upper frame means and being movable in a manner such that said pressure plate means is caused to move from said raised position to said lowered position; wherein there are at least two said cam means; and (d) handle means carried by said upper frame means for controlling movement of said cam means.

31. A test fixture clamping system for holding a circuit board in a test fixture for testing comprising:

(a) upper and lower frame means pivotably connected to each other;

(b) pressure plate means carried by said upper frame means and being movable between raised and lowered positions;

(c) ramp means carried by said pressure plate means;

(d) cam means carried by said upper frame means and being movable between first and second positions; wherein said cam means is in contact with said ramp means; wherein said cam means moves up said ramp means to move said pressure plate means from said raised position to said lowered positions;

(e) handle means pivotably mounted to said upper frame means for controlling movement of said cam means; and (f) linking means connected between said handle means and said cam means.

* * * * *